(12) United States Patent
Iyer et al.

(10) Patent No.: US 9,882,664 B2
(45) Date of Patent: *Jan. 30, 2018

(54) INTERACTIVE ENTERTAINMENT SYSTEM (71) Applicant: Adori Labs, Inc., Santa Clara, CA (US)

(72) Inventors: Viswanathan Iyer, Santa Clara, CA (US); Kartik Parija, Bangalore (IN); Andrew Cole, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/292,140

(22) Filed: Oct. 13, 2016

(65) Prior Publication Data

US 2017/0141864 A1    May 18, 2017

Related U.S. Application Data (63) Continuation of application No. 13/895,257, filed on May 15, 2013, now Pat. No. 9,484,964, which is a continuation-in-part of application No. 13/874,360, filed on Apr. 30, 2013, now Pat. No. 8,787,822, and a continuation-in-part of application No. 13/874,374, filed on Apr. 30, 2013, now abandoned.

(60) Provisional application No. 61/760,586, filed on Feb. 4, 2013, provisional application No. 61/721,531, filed on Nov. 2, 2012, provisional application No. 61/698,266, filed on Sep. 7, 2012.

(51) Int. Cl.
*H04H 40/00* (2009.01)
*H04H 60/66* (2008.01)
*H04B 1/06* (2006.01)
*H04H 20/38* (2008.01)
*H04H 60/73* (2008.01)
*H04H 60/27* (2008.01)

(52) U.S. Cl.
CPC .............. *H04H 60/66* (2013.01); *H04B 1/06* (2013.01); *H04H 20/38* (2013.01); *H04H 60/73* (2013.01)

(58) Field of Classification Search
CPC .... H04H 20/34; H04H 40/54; H04H 2201/03; H04N 7/173
USPC .......................................... 455/3.01–3.06, 45
See application file for complete search history.

(56) References Cited

U.S. PATENT DOCUMENTS 8,787,822 B2 * 7/2014 Iyer ...................... H03J 1/0008
                                                          455/3.06
9,484,964 B2 * 11/2016 Iyer .......................... H04B 1/06

* cited by examiner

*Primary Examiner* — Lee Nguyen (57) ABSTRACT

Disclosed here is an interactive audio system and a method of operating the same. In one embodiment, the interactive audio system comprises a processor and a receiving module for receiving a radio frequency (RF) carrier signal associated with a broadcast station. The audio system further comprises a memory storing computer-executable instructions, where the processing module is configured to access and execute the computer-executable instructions to perform a set of acts. The acts include shifting a frequency associated with the received RF carrier signal to an intermediate frequency (IF). The acts include demodulating the frequency shifted portion of the RF carrier signal associated with the broadcast station, the demodulation resulting in an output signal. The acts further include extracting an embedded data from the demodulated output signal. The acts further include serving the embedded data in conjunction with the demodulated audio signal.

30 Claims, 8 Drawing Sheets

INTERACTIVE ENTERTAINMENT SYSTEM

CLAIM OF PRIORITY

This application is a Continuation of U.S. patent application Ser. No. 13/895,257, filed on May 15, 2013, which in turn is a Continuation-in-Part of U.S. patent application Ser. No. 13/874,360, filed Apr. 30, 2013, which in turn claims the benefit of U.S. Provisional Application No. 61/760,586, filed on Feb. 4, 2013, U.S. Provisional Application No. 61/721,531, filed Nov. 2, 2012, and U.S. Provisional Application No. 61/698,266, filed Sep. 7, 2012; and is also a Continuation-in-Part of U.S. patent application Ser. No. 13/874,374, filed Apr. 30, 2013, which in turn claims the benefit of U.S. Provisional Application No. 61/760,586, filed on Feb. 4, 2013, and U.S. Provisional Application No. 61/698,266, filed Sep. 7, 2012, all of which are incorporated herein by reference for all purposes in their entirety.

FIELD

The present invention generally relates to an entertainment system.

BACKGROUND

Consumers are spending a significant amount of time listening to AM/FM radio stations during the course of the day, including when traveling in the automobiles. However, listening to AM/FM radio stations is a passive experience, where the listeners have a choice of either listening to what is being broadcast or simply changing channels. There is little interaction between the listeners and radio stations. For example, the listeners have no means of interacting with the radio stations to register their interest in the program being broadcast other than calling the radio stations. Similarly, the radio stations have few means of learning their audience interest directly from their listeners.

Traditionally, AM/FM radio stations have relied on listeners calling the radio stations to register their interest or surveys of a sample population of listeners, conducted by third parties such as Nielsen Media, to determine their listener interests and the reach of their audio programs. However, such surveys can be misleading due to various factors, such as how the sample population of radio listeners were chosen for the survey, how the sampled population understands terms such as "listening" when responding to queries of the survey, etc.

Among teaching a variety of other things, certain aspects of the inventions herein have embodiments which may satisfy one or more of the above-described issues.

SUMMARY

Introduced here are methods, systems, paradigms and structures for providing an entertainment system. In one embodiment, an interactive audio system comprises a processor and a receiving module for receiving a radio frequency (RF) carrier signal associated with a broadcast station. The audio system further comprises a memory storing computer-executable instructions, where the processing module is configured to access and execute the computer-executable instructions to perform a set of acts. The acts include shifting a frequency associated with the received RF carrier signal to an intermediate frequency (IF). The acts include demodulating the frequency shifted portion of the RF carrier signal associated with the broadcast station, the demodulation resulting in an output signal. The acts further include extracting an embedded data from the demodulated output signal, where the embedded data can be utilized to interact with a party associated the embedded data. The acts further include serving the embedded data in conjunction with the demodulated audio signal.

This Summary is provided to introduce a selection of concepts in a simplified form that are further described in the Detailed Description and drawings. This Summary is not intended to identify essential features of the claimed subject matter or to limit the scope of the claimed subject matter.

BRIEF DESCRIPTION OF THE DRAWINGS

These and other objects, features and characteristics of the present invention will become more apparent to those skilled in the art from a study of the following detailed description in conjunction with the appended claims and drawings, all of which form a part of this specification. In the drawings:

DETAILED DESCRIPTION

In order to provide a more interactive listening experience to audio listeners, especially to radio listeners who are listening to radio in their vehicles, the inventors have conceived a software and/or hardware facility ("the facility") that facilitates interactive communication between broadcast stations (and other interested third parties) and their listeners by enabling sharing of data utilizing existing communication channels, where the shared data can be utilized to facilitate interaction.

In some embodiments, the facility implements a technique for encoding data within the broadcasted audio programs, allowing the encoded data to be shared with the listeners through the existing communication channels utilized to broadcast the audio programs. The disclosed facility further includes a technique for decoding the encoded data from the audio program using a receiver that receives the broadcast audio program, allowing the decoded data to be provided to a listener who is using the receiver. The disclosed facility further implements a technique for enabling the listener to interact with the broadcast stations utilizing the decoded data.

Hereinafter, descriptions will be provided on embodiments of the facility with reference to the drawings.

References in this description to "an embodiment", "one embodiment", or the like, mean that the particular feature, function, or characteristic being described is included in at least one embodiment of the facility. Occurrences of such phrases in this specification do not necessarily all refer to the same embodiment, nor are they necessarily mutually exclusive.

Various examples of the techniques introduced above will now be described in further detail. The following description provides specific details for a thorough understanding and enabling description of these examples. One skilled in the relevant art will understand, however, that the techniques discussed herein may be practiced without many of these details. Likewise, one skilled in the relevant art will also understand that the techniques can include many other obvious features not described in detail herein. Additionally, some well-known structures or functions may not be shown or described in detail below, so as to avoid unnecessarily obscuring the relevant description.

The terminology used below is to be interpreted in its broadest reasonable manner, even though it is being used in conjunction with a detailed description of certain specific examples of the facility. Indeed, certain terms may even be emphasized below; however, any terminology intended to be interpreted in any restricted manner will be overtly and specifically defined as such in this section.

Figure 1A:
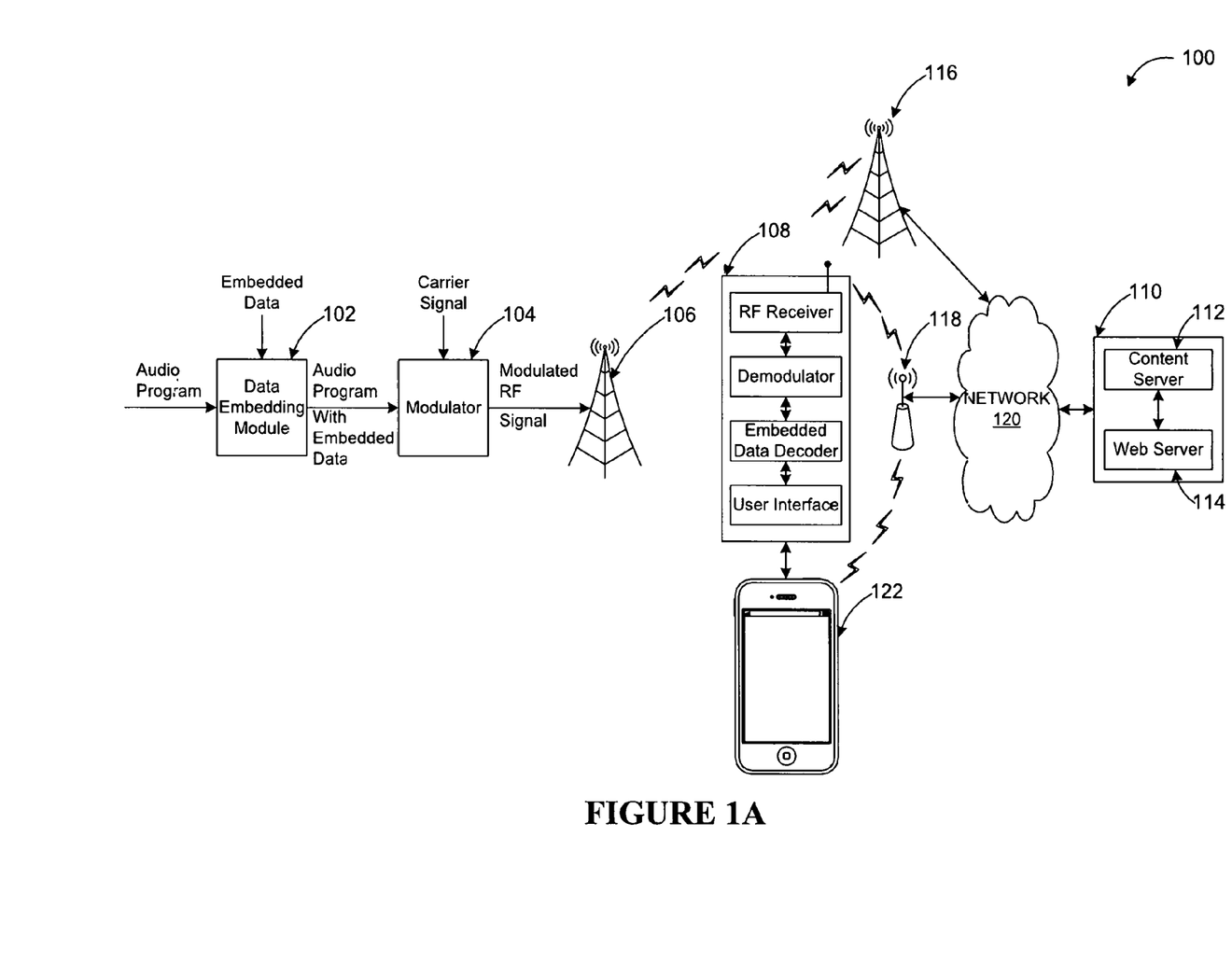
FIG. 1A provides a brief, general description of a representative environment in which the invention can be implemented.

FIG. 1A and the following discussion provide a brief, general description of a representative environment in which the invention can be implemented. Although not required, aspects of the facility may be described below in the general context of computer-executable instructions, such as routines executed by a general-purpose data processing device (e.g., a server computer or a personal computer). Those skilled in the relevant art will appreciate that the facility can be practiced with other communications, data processing, or computer system configurations, including: wireless devices, Internet appliances, hand-held devices (including personal digital assistants (PDAs)), wearable computers, all manner of cellular or mobile phones, multi-processor systems, microprocessor-based or programmable consumer electronics, set-top boxes, network PCs, mini-computers, mainframe computers, and the like. Indeed, the terms "computer," "server," and the like are used interchangeably herein, and may refer to any of the above devices and systems.

While aspects of the facility, such as certain functions, are described as being performed exclusively on a single device, the facility can also be practiced in distributed environments where functions or modules are shared among disparate processing devices. The disparate processing devices are linked through a communications network, such as a Local Area Network (LAN), Wide Area Network (WAN), or the Internet. In a distributed computing environment, program modules may be located in both local and remote memory storage devices.

Aspects of the facility may be stored or distributed on tangible computer-readable media, including magnetically or optically readable computer discs, hard-wired or preprogrammed chips (e.g., EEPROM semiconductor chips), nanotechnology memory, biological memory, or other data storage media. Alternatively, computer-implemented instructions, data structures, screen displays, and other data related to the invention may be distributed over the Internet or over other networks (including wireless networks) on a propagated signal on a propagation medium (e.g., an electromagnetic wave(s), a sound wave, etc.) over a period of time. In some implementations, the data may be provided on any analog or digital network (packet switched, circuit switched, or other scheme).

As shown in FIG. 1A, an embodiment of a data embedding module 102 that can be utilized to embed data within audio signals (i.e. signals associated with audio programs) is provided. In embodiments, the data to be embedded within the audio signals is dynamic and can change in real-time, where the data can include a combination of text, bar codes, quick response ("QR") codes, images including images of QR codes, multimedia content, etc. For example, the image can be a picture taken in a party being thrown by a broadcast station while the text can be Tweets (i.e., messages being exchanged over Twitter) received by the broadcast station from listeners of the broadcast station.

In embodiments, the data embedding module 102 embeds a dynamic data in real-time (i.e., as the data is being received) within the audio signal as they are being broadcast. For example, the Tweets appearing on a broadcast station's home timeline (i.e., a real-time list of Tweets being received on Twitter) can be embedded, as they are received, within the audio signal of audio program before being broadcast by the broadcast station.

In embodiments, the data embedding module 102 embeds the data within the audio signal of the audio programs independent of the time of the broadcast of the audio programs. For instance, when the data to be embedded is static, such as an existing coupon for an advertised product, the data embedding module 102 embeds the static data within the audio signal of the audio programs independent of the time of the broadcast of the audio programs. In another instance, before distributing their music, an artist can embed their music with any data utilizing the data embedding module 102. Such a method of pre-embedding static data within their music allows any broadcast station, whether capable of embedding data or not, to broadcast the artist's music with the embedded data. In one instance, the artists can embed data that can enable a listener to purchase the music directly from the artists or through a channel authorized by the artists. For example, the embedded data could be a URL link to the artist's website, where the listener can purchase and download the music from. Such a system can enable the artists to directly market their music to the listeners and completely avoid third-party marketing channels, such as iTunes, to market their music. As discussed earlier, after pre-embedding static data within the audio programs, the broadcast station can then broadcast the audio programs with static embedded data without requiring data to be embedded in real-time.

For example, marketing promotions, such as discount coupons, provided by marketing agencies, can be embedded in audio programs and stored. The stored audio programs with the embedded coupons can then be broadcast through various channels, enabling the promotion to be available to all the listeners of the audio program irrespective of the broadcast channel the audio program was provided through. The various channels for broadcasting the audio program with the embedded data can include radio bands, such as FM, AM, satellite, etc.

Figure 2A:
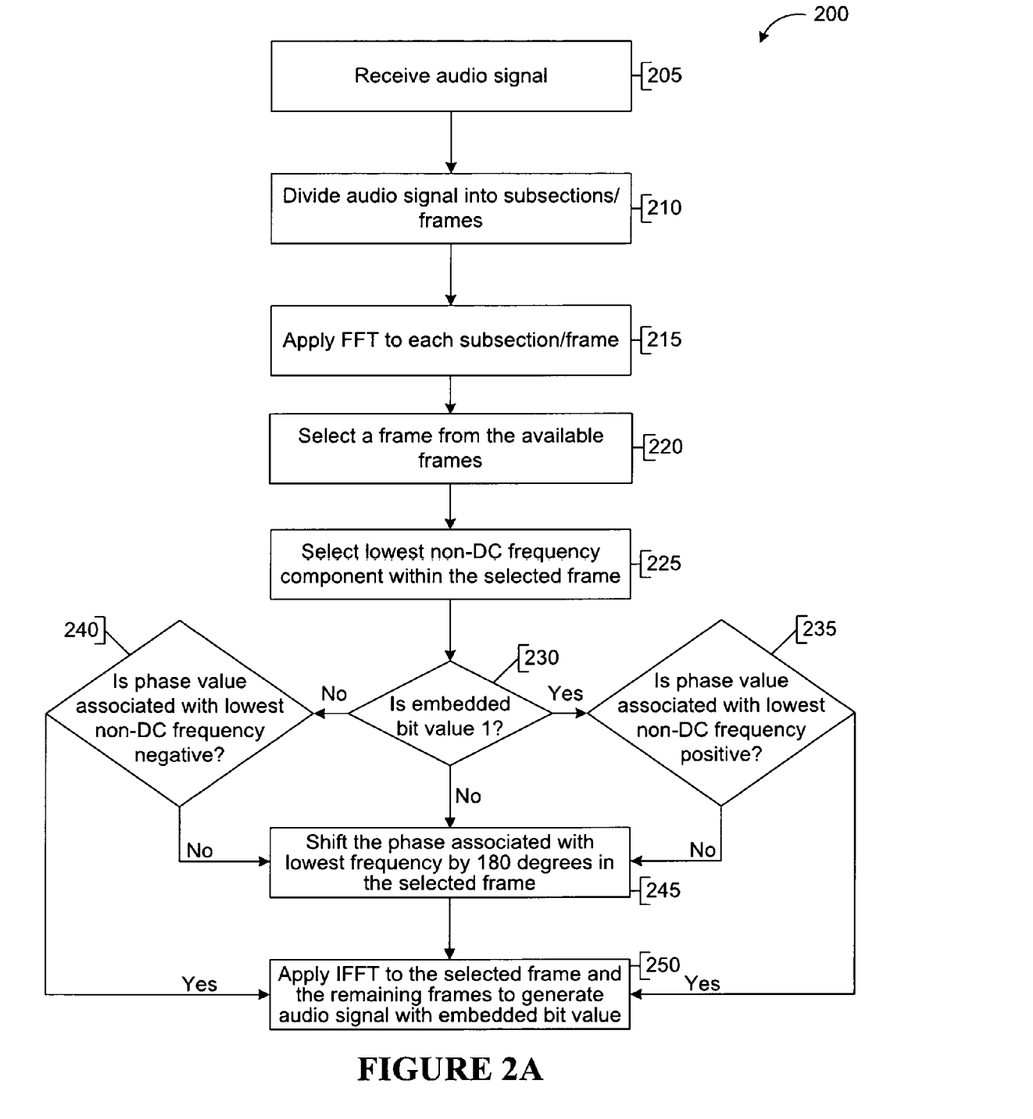
FIG. 2A provides a flowchart of a method for embedding binary data of the embedded data into the audio signals associated with audio programs.

The data embedding module 102 can be implemented either as hardware, software, or a combination of both. In embodiments, the data embedding module 102 converts the data to be embedded into binary format before encoding the binary data (of the embedded data) into the audio signals. In embodiments, the data embedding module 102 splits the audio signals into its constituent frequency components before embedding the binary data within the constituent frequency components. FIG. 2A provides additional details of one technique the data embedding module 102 can utilize to encode the binary data into the audio signals (associated with the audio programs).

It should be noted that the conversion of data to be embedded into its binary format before embedding the binary data in the audio signals is meant to illustrate one implementation of embedding data within audio signals and should not be considered as limiting the invention to using just the illustrated implementation. Other methods, such as creating a scaled value of the data to be appropriately encoded within a component of the audio signal (e.g., the magnitude of the audio signals), that be used to embed data without affecting the perceptible audio quality of the audio signal can be utilized to embed the data within the audio signals.

As shown in FIG. 1A, the data embedding module 102 shares the audio program with the embedded data with a modulator 104 that modulates (i.e. embeds) the audio program within a carrier signal that can be broadcast. In embodiments, the modulator 104 varies one or more properties of a periodic waveform (also referred to as the carrier signal) with the audio signals (associated with the audio program with the embedded data) to modulate the audio signal within the carrier signal. Typically, the carrier signal is a high-frequency sinusoid with the properties of the carrier signal being varied includes amplitude (for amplitude modulated, or AM signals), frequency (for frequency modulated, or FM signals), etc.

The modulator 104 can be implemented either as hardware, software, or a combination of both. In embodiments, the modulator 104 can implement any well-known modulation techniques to modulate analog audio signals (with the embedded data) into a high frequency carrier signal, such as a radio-frequency signal (RF signal). For example, a broadcast station using FM to broadcast audio programs over 88.5 MHz frequency can modulate the audio program over a sinusoidal RF signal of frequency 88.5 MHz and broadcast the modulated RF signal.

As discussed earlier, the modulated RF signal not only carries the audio signals of the audio program, but also the embedded data within the audio signals. Further, as shown in FIG. 1A, the modulator 104 shares the modulated RF signal with a broadcast tower 106 that broadcasts the modulated RF signal. As discussed earlier, the RF signal can be amplitude modulated, frequency modulated, or modulated in any other well-known modulation formats. In embodiments, the broadcast tower 106 can broadcast the modulated RF signal without being limited by the modulation of the RF signal.

As shown in FIG. 1A, the modulated RF signal is received by an audio streaming device 108. In embodiments, the audio streaming device 108 includes a RF receiver module 108a to receive the modulated RF signal. In embodiments, the receiver module 108a receives RF signals broadcast over a particular radio band (e.g., the FM radio band ranging from 87.5 MHz to 108.0 MHz), allowing a user to choose and listen to audio programs of any broadcast station broadcasting within the particular radio band. In embodiments, the audio streaming device 108 and its various modules can be implemented either as hardware, software, or a combination of both.

In embodiments, the audio streaming device 108 includes a demodulator module 108b to demodulate the audio program signals modulated within the received RF carrier signal. In embodiments, the demodulator module 108b includes an oscillator (not shown) and a mixer (not shown) to down convert the frequency of the RF carrier signal to a lower intermediate frequency (IF) before further processing of the RF carrier signal. In embodiments, the demodulator module 108b includes a low pass filter (not shown) to receive the down-converted RF signal and select/filter a portion of RF signal associated with a given broadcast channel (e.g., broadcast channel of a particular radio station).

In embodiments, the demodulator module 108b demodulates (i.e. extract) the audio program with the embedded data from the filtered portion of RF signal associated with the given broadcast channel. In embodiments, the demodulator module 108b includes particular demodulators for demodulating RF signals with a particular type of modulation, such as an envelope detector to demodulate audio program from an amplitude modulated (AM) RF signal, a quadrature detector for demodulating frequency modulated (FM) RF signals, etc.

In embodiments, the audio streaming device 108 includes an embedded data decoder module 108c to detect and decode the embedded data within the audio signals of the demodulated audio program (i.e. demodulated from the received RF carrier signal). In embodiments, the embedded data decoder module 108c can be implemented either as hardware, software, or a combination of both. In embodiments, the embedded data decoder module 108c splits the audio signals associated with the demodulated audio program into its constituent frequency components before detecting and decoding the embedded data within the audio signals.

In embodiments, the embedded data decoder module 108c detects the embedded data as binary data from the constituent frequency components of the audio program before converting the detected binary data into the embedded data. As discussed earlier, the data embedded within the audio signals can include images, text, bar codes, numerical, multimedia content, etc. In embodiments, the embedded data decoder module 108c decodes a portion of the binary data (e.g., first five bits of every hundred bits after a synchronizing point) to determine the data type of the embedded data before applying an appropriate decoding algorithm based on the determined data type to decode the embedded data.

For example, when the type of the embedded data is determined to be an image, the embedded data decoder module 108c converts a predetermined number of detected bits into M*N pixels of the image using an appropriate binary to pixel conversion algorithm. In embodiments, the decoding algorithm utilized in embedded data decoder module 108c corresponds to the encoding algorithm utilized by the broadcast station when encoding the embedded data as binary data within the audio signals.

Figure 3:
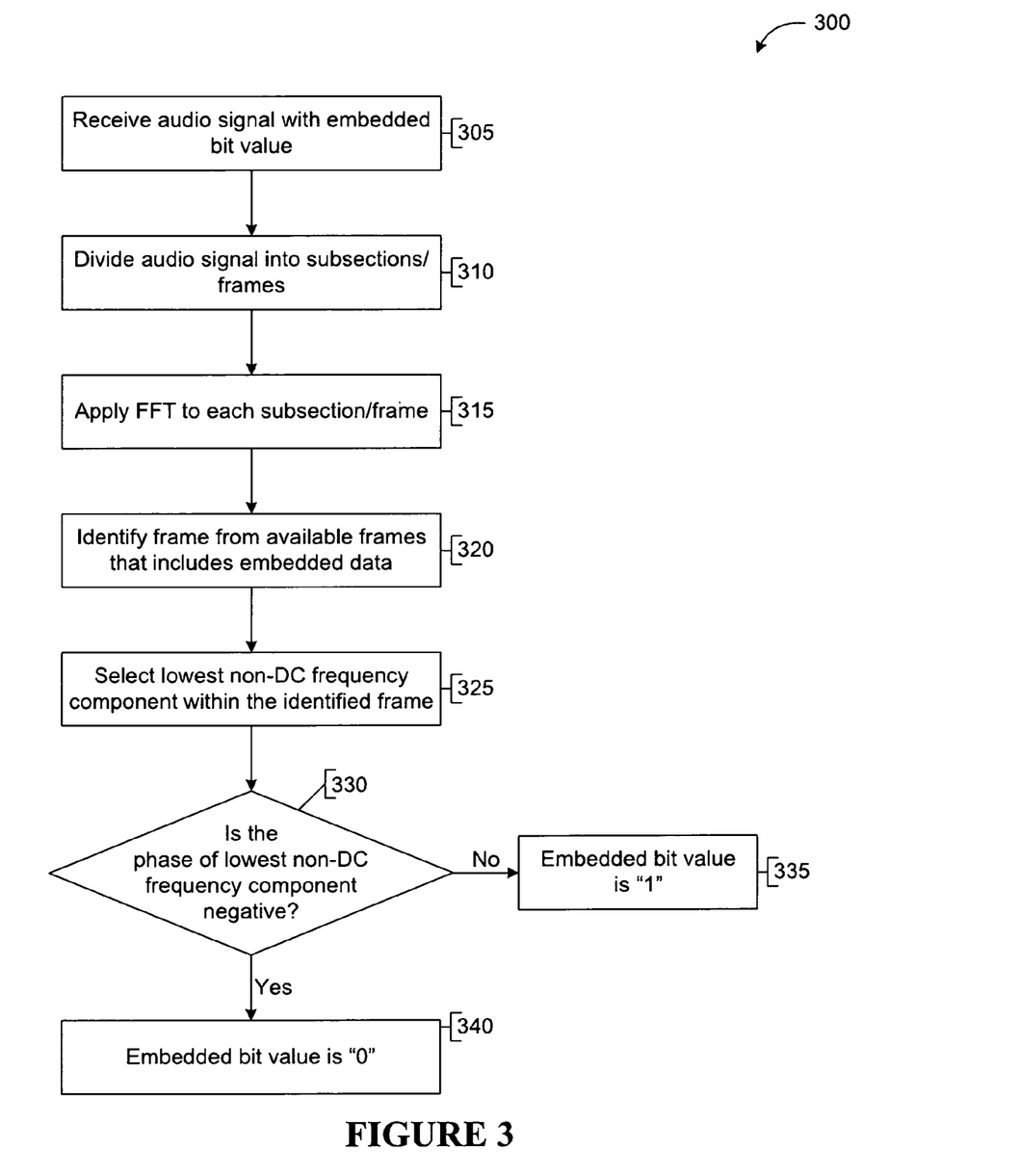
FIG. 3 provides a flowchart of a method for detecting and decoding the embedded data from the audio signals.

In embodiments, the embedded data decoder module 108c includes decoding algorithms that correspond to the encoding algorithms of each of the broadcast stations (when different). Based on the broadcast station whose audio program is being decoded, the embedded data decoder module 108c chooses and applies the appropriate decoding algorithm for decoding the embedded data. FIG. 3 provides additional details of one technique the embedded data decoder module 108c can utilize to detect and decode the embedded data from the audio signals (associated with the audio programs).

In embodiments, the audio streaming device 108 includes a user interface 108d to allow a user to interact with the audio streaming device 108. In embodiments, the user interface 108*d* includes a display module (not shown) to display the decoded embedded data to the user. For example, decoded texts of embedded Tweets can be displayed to the user through the display module of the audio streaming device 108. In embodiments, the display module includes a touch panel to allow the user to provide input to the audio streaming device 108 through the touch panel. In embodiments, the user interface 108*d* allows a user to interact with the displayed embedded data through the touch-sensitive display panel. For example, a user can click on a displayed image of a coupon, decoded from the embedded data, to store the coupon in the audio streaming device 108 for later use.

In embodiments, the audio streaming device 108 shares the decoded embedded data with other personal computing devices of the user. In embodiments, the other personal computing devices of the user includes a mobile device 122, such as a smartphone, which can communicate with the audio streaming device 108 through a communication interface (not shown) included within the audio streaming device 108. In embodiments, the mobile device 122 interacts with the audio streaming device 108 to gather the decoded embedded data available through the audio streaming device 108.

In embodiments, the audio streaming device 108 displays the embedded data, allowing the user to visually capture the displayed data using their mobile device 122. For example, a displayed image of a QR code can either be scanned or captured as a photo by the user using the mobile device 122, where the QR code can be further processed. Additional details of an audio streaming device 108 are disclosed in, for example, in co-pending U.S. patent application Ser. No. 13/874,360 of V. Iyer et al., filed on the Apr. 30, 2013 and entitled, "Entertainment System", which is incorporated herein by reference. It should be noted that other audio streaming devices are capable of being enhanced or created for use in accordance with the principles described herein.

As shown in FIG. 1A, in embodiments, the audio streaming device 108 and the mobile device 122 may communicate with a network, enabling the devices 108, 122 to perform additional functions, based on the decoded embedded data, for the user. As shown in FIG. 1A, a user may use a personal computing device (e.g., a mobile device 122, etc.) or the audio streaming device 108 to communicate with a network. The term "mobile device," as used herein, may be a cell phone, a personal digital assistant (PDA), a portable email device (e.g., a Blackberry®), or any other device having communication capability to connect to the network using cellular services.

In embodiments, the mobile device 122 or the audio streaming device 108 connects using one or more cellular transceivers or base station antennas 116 (in cellular implementations), access points, terminal adapters, routers, modems or Wireless Fidelity (WiFi) access point 118 (in IP-based telecommunications implementations), or combinations of the foregoing (in converged network embodiments). WiFi access points are part of a WiFi network, which operate according to Institute of Electrical and Electronic Engineers (IEEE) 802.11 standard. These WiFi networks are generally private LAN networks, such as those networks found in a home or a small office, and typically have an indoor range of one hundred and fifty to three hundred feet, with performance likely to degrade as the distance increases.

In some instances, the network 120 is the Internet, allowing the audio streaming device 108 or the mobile phone 122 (with, for example, WiFi capability) to access web content offered through various web servers 114. In some instances, especially where the phone 122 is used to access web content through the network 120 (e.g., when a 3G or an LTE service of the phone 122 is used to connect to the network 120), the network 120 may be any type of cellular, IP-based or converged telecommunications network, including but not limited to Global System for Mobile Communications (GSM), Time Division Multiple Access (TDMA), Code Division Multiple Access (CDMA), Orthogonal Frequency Division Multiple Access (OFDM), General Packet Radio Service (GPRS), Enhanced Data GSM Environment (EDGE), Advanced Mobile Phone System (AMPS), Worldwide Interoperability for Microwave Access (WiMAX), Universal Mobile Telecommunications System (UMTS), Evolution-Data Optimized (EVDO), Long Term Evolution (LTE), Ultra Mobile Broadband (UMB), Voice over Internet Protocol (VoIP), Unlicensed Mobile Access (UMA), etc.

In some instances, the user uses one of the personal computing devices (e.g., the mobile phone 122) or the audio streaming device 108 to connect to a broadcast station server 110 through the network 120. In some embodiments, the broadcast station server 110 comprises a content server computer 112 coupled to a local database (not shown). The term "broadcast station server" as indicated herein, refers to a server station or other computing apparatus capable of hosting a web service, through a web server 114, which is accessible by other computing systems (e.g., the mobile device 122) through, for example, the Internet 120.

In embodiments, the broadcast station server 110 hosts content associated with a broadcast station and provides one or more services offered by the broadcast station for its listeners. In embodiments, the broadcast station server 110 interacts with the mobile phone 122 (or the audio streaming device 108) to receive the decoded embedded data being shared by the user with the broadcast station server 110. In embodiments, the broadcast station server 110 provides customized service for the user based on the received embedded data. In embodiments, the broadcast station server 110 receives embedded data, such as QR codes, and provides pre-associated services (e.g., services associated with the QR code as stored in the local database) associated with the QR codes for the user.

In embodiments, the broadcast station server 110 allows the user to store the embedded data, including digital coupons, received from the broadcast station in the local database of the broadcast station server 110. In embodiments, the broadcast station server 110 allows the user to purchase and store concert tickets, digital content, including music, etc., through the server 110 using the embedded data, such as digital coupons, provided by the broadcast station.

In embodiments, the broadcast station server 110 creates and associates user accounts for users on the server 110 to store the embedded data, purchases and other user associated information in the user accounts. In embodiments, the broadcast station server 110 creates and associates user accounts for users based on identification information provided through the mobile phone 122 (or the audio streaming device 108), such as electronic identification (EID) number associated with the devices.

For example, QR codes can be associated with digital coupons, marketing websites, audio programs, etc., in the local database on the broadcast station server 110. When a particular QR code associated with a digital coupon for music downloads is received from a user through the mobile phone 122 (or the audio streaming device 108), the broadcast station server 110 matches the received QR code against the pre-associated services stored in the local database and retrieves and serves the digital coupon for music downloads to the user.

In another example, a QR code can be associated with particular websites, such as concert promotion websites, allowing the broadcast station server 110 to retrieve and serve the particular website to the user through their mobile phone 122 when the associated QR code is received by the broadcast station server 110. Such concert promotion websites, for example, can allow the user to quickly and easily purchase tickets for a concert as they are being advertised over the broadcast station.

In another example, a QR code received from a broadcast station can be associated with concert tickets for a particular show, allowing the broadcast station server 110 to purchase and store the concert tickets for the particular show in the broadcast server 110 when the QR code is received by the broadcast station server 110 from the user (either through the mobile phone 122 or the audio streaming device 108). The broadcast station server 110 can utilize any payment means available to the broadcast station server 110 that is associated with the user purchasing the tickets.

In embodiments, the broadcast station server 110 utilizes the information associated with the various user interactions with the server 110 to help determine reach of a given broadcast station. In embodiments, the broadcast station server 110 utilizes the number of listeners who shared the decoded embedded data with the broadcast station server 110 to determine a likely reach of the broadcast station for the audio program carrying the embedded data. For example, digital coupons being embedded in an audio program can be time-stamped to distinguish the same digital coupons when embedded in other audio programs.

The broadcast station server 110 can associate with the time-stamp with the embedded audio program, irrespective of when the user shared the digital coupon with the broadcast station server 110. This allows the broadcast station server 110 to determine the reach of a given audio program irrespective of when the listener listened to the audio program (e.g., when the listener time-shifted the listening of the audio program by recording the audio program).

In embodiments, the broadcast station server 110 utilizes the demography information of the user (gathered through the user's computing devices and other sources) and the digital coupons redeemed to by the users to determine the appeal of different promotions across different demography. Such information can allow marketing agencies to better fine tune their campaign to appeal to their targeted demography.

For example, promoting a new sneaker with a digital coupon for a free music download might best appeal to the younger demography that consumes most of their music through digital music players. Other user behavior information and marketing effectiveness can be determined by the broadcast station server 110 utilizing various user interaction information, such as music being purchased with digital coupons, the audio programs through which most coupons reach users, the demography of the user and the type of promotions that appeal to each demography, etc.

In embodiments, the broadcast station server 110 utilizes the information associated with the various user interactions with the server 110 to determine the music interest of a particular user. Such determined music interest of the particular user can be stored in the user account associated with the particular user on the broadcast station server 110. In embodiments, the broadcast station server 110 utilizes the determined music interest of the particular user to provide a custom digital radio station for the user.

In embodiments, the broadcast station server 110 streams the custom digital radio station to any digital music player associated with the user, such as a mobile phone 122, which can communicate with the broadcast station server 110. The above discussion provides an illustration of the various interactive services that a broadcast station can provide its listeners utilizing the embedded data in the audio programs provided to the listeners. It should be noted that additional services, not discussed above, can be rendered by the broadcast station utilizing the embedded data utilizing well-known methods and the above discussion should not be considered limiting the possible services to just those disclosed.

Figure 1B:
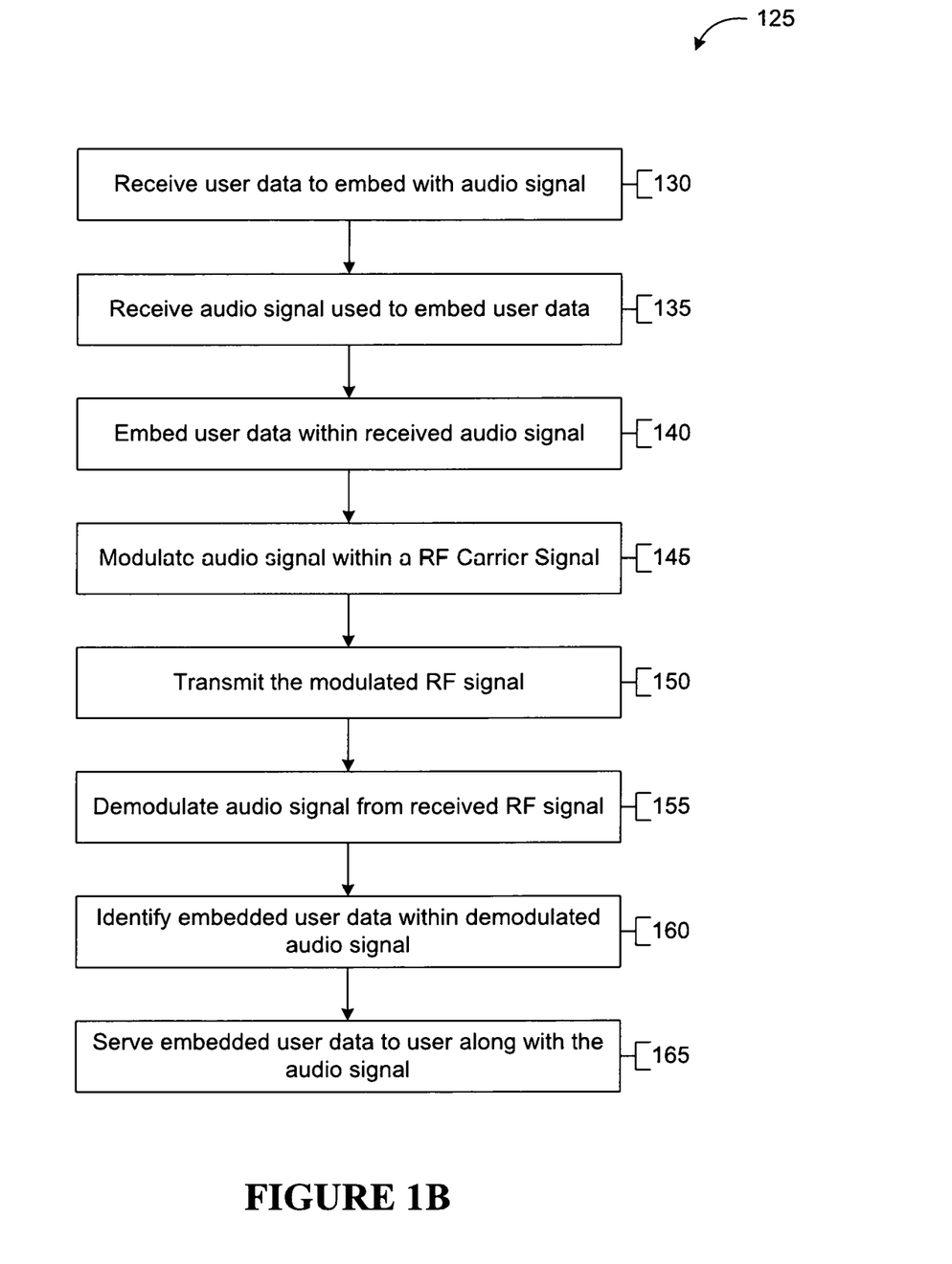
FIG. 1B a flow chart illustrating a method for providing an interactive entertainment system for a user in the above described general environment.

FIG. 1B a flow chart illustrating a method 125 for providing an interactive entertainment system for a user in the general environment described above with reference to FIG. 1A. In step 130 of method 125, the dynamic data (e.g., user generated data such as Twitter messages) to be embedded within the audio signal is gathered. In step 135 of method 125, the audio signal within which to embed the received dynamic data is chosen. For example, a 60 ms portion of audio signal from the audio signals of audio program being broadcast is chosen to embed the data. In step 140 of method 125, the received dynamic data is embedded within a chosen portion of the received audio signal. FIG. 2A provides further details of a technique for embedding data within audio signal.

In step 145 of method 125, the audio signal with the embedded data is modulated within a RF carrier signal. For example, the audio signal with the embedded data can be frequency modulated on a RF carrier signal in the FM broadcast frequency. In step 150 of method 125, the modulated RF carrier signal is broadcast. In step 155 of the method 125, the transmitted RF carrier signal is received and the audio signal is demodulated from the received RF carrier signal. For example, a quadrature detector can be utilized to demodulate audio signals that are frequency modulated on a RF carrier signal.

In step 160 of the method 125, the embedded user data is detected and decoded from the demodulated audio signal. FIG. 3 provides further details of a technique for detecting and decoding embedded data within audio signal. In step 165 of the method 125, the decoded embedded data is provided to the user. For example, the decoded embedded data can be an image of a QR code, associated with a digital coupon, which can be displayed to the user.

FIG. 2A provides a flowchart of a method 200 for embedding binary data of the embedded data into the audio signals associated with audio programs. In step 205 of method 200, the audio signal within which data is embedded is received. In step 210 of the method 200, the audio signal is divided into one or more subsection (also referred to as "frames"), where each subsection represents a portion of the audio program timeline associated with the audio signal (e.g., 60 milliseconds of the audio program). In step 215 of the method 200, for each given frame, the frequency domain data of the audio signal in the given frame is generated from the provided time domain data of the audio signal in the given frame.

Figure 2B:
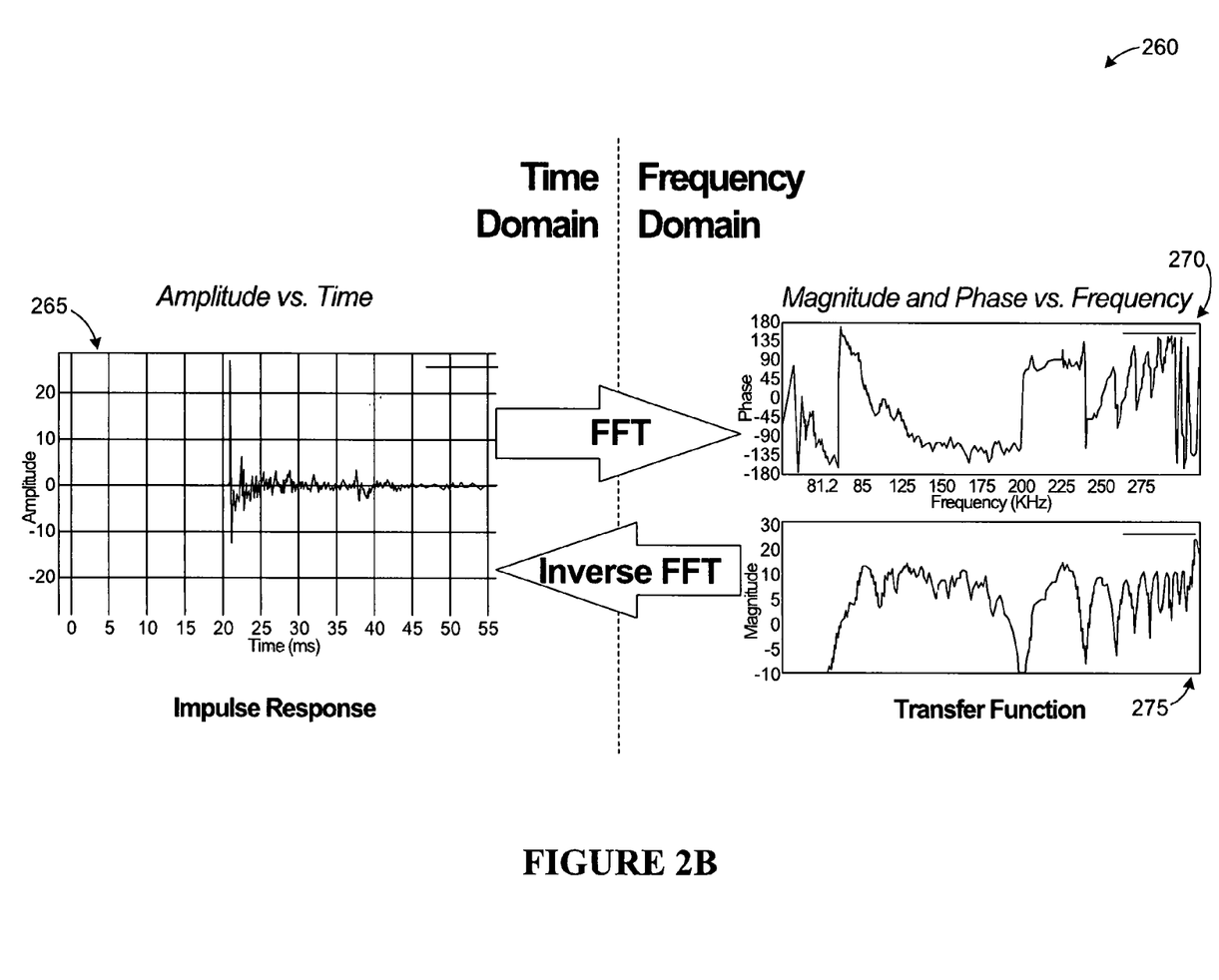
FIG. 2B provides an example of an audio signal and its associated time domain and frequency domain data.

In the time domain data, audio signal is provided as change in amplitude over time. FIG. 2B provides an example of an audio signal provided in the time domain 265, where the amplitude of the represented audio signal varies from −10 to over 20 over the 55 ms time period. In one instance, Fast Fourier Transform or FFT, method is used to generate the frequency domain data of the audio signal from the time domain data of the audio signal. The Fourier Transform allows a time domain data of audio signal to be converted into complex frequency domain data of the audio signal, where the frequency domain data (i.e. the spectral data) contains information about both the amplitude and phase of the sinusoidal components that make up the audio signal.

In step 215, any well-known implementation of the FFT can be utilized to generate the frequency domain data of the audio signal. FIG. 2B provides an example of an audio signal provided about both the amplitude 270 and phase 275 of the sinusoidal components with respect to the frequency of the sinusoidal components that make up the audio signal in the frequency domain. In FIG. 2B, the magnitude (i.e. amplitude) of each sinusoidal components 270 represented by their respective frequency is provided, where the magnitude changes from −10 to over 20. In FIG. 2B, the phase angle of each sinusoidal components 275 represented by their respective frequency is provided, where the phase angle changes from −180 to 180 degrees and the frequency of the sinusoidal components changes from 0 Hz (DC component) to over 275 KHz (non-DC components).

In step 220, one of the frames (and its associated frequency domain data) from the available frames is chosen to embed a single bit of binary data associated with the embedded data. In one instance, the choice of frame can be based on the timeline of the audio program represented by the audio signals within the chosen frame. As discussed earlier, the data to be embedded, e.g., images or text, or converted into a linear array of binary data that can be embedded within the audio signals. The binary data can later be used to recreate the embedded data in its original form, e.g. text format of the embedded data.

In step 225, the sinusoidal component with the lowest non-DC (i.e. greater than 0 Hz) frequency is chosen from the frequency domain data of the frame selected in step 220, where the chosen component is utilized to embed the bit of binary data within the frequency domain data of the selected frame. In step 230, determine whether the binary bit to embed is "1" or "0".

If the binary bit to encode is "1", in step 235, determine whether the phase angle of the selected sinusoidal component is positive (i.e. between 0 and 180 degrees). If the phase angle is positive, move to step 250. On the other hand, if the determined phase angle of the selected sinusoidal component is negative (i.e. between −180 and 0 degrees), then move to step 245. In step 245, shift the phase angle of the selected sinusoidal component by 180 degrees. For example, if the phase angle is −90 degrees and the bit to be encoded is "1", then the phase angle is shifted by 180 degrees to 90 degrees.

If the binary bit to encode is "0", in step 240, determine whether the phase angle of the selected sinusoidal component is negative (i.e. between −180 and 0 degrees). If the phase angle is negative, move to step 250. On the other hand, if the determined phase angle of the selected sinusoidal component is positive (i.e. between 0 and 180 degrees), then move to step 245. In step 245, shift the phase angle of the selected sinusoidal component by 180 degrees. For example, if the phase angle is 90 degrees and the bit to be encoded is "0", then the phase angle is shifted by 90 degrees to −90 degrees.

In step 250, the frequency domain data of the various frames, including the frames with the phase shifted sinusoidal component, is converted back into time domain audio signals. In one instance, the Inverse Fast Fourier Transform or IFFT, method is used to generate the time domain data of the audio signal from the frequency domain data of the audio signal from the various frames. The Inverse Fourier Transform allows the complex frequency domain data of the audio signal to be converted back into a time domain data of audio signal, where the time domain data contains information about the change in amplitude of the audio signal over time.

The converted audio signal now includes the binary bit embedded in the phase angle of the lowest non-DC sinusoidal component in a selected frame. In step 250, any well-known implementation of the IFFT can be utilized to generate the time domain data of the audio signal. FIG. 2B provides an example of a time domain based audio signal 265 generated from the frequency domain data 270, 275 associated with the audio signal. The above described method 200 can be repeated till all the binary bits associated with the embedded data is embedded within the audio signals of associated audio program before the audio program is broadcast.

FIG. 3 provides a flowchart of a method 300 for detecting and decoding the embedded data from the audio signals, where the data was embedded within the audio signals using the method 200. In step 305, the audio signal with the embedded binary bit is received. In step 310, similar to step 210 of method 200, the audio signal is divided into subsections/frames. In step 315, similar to step 215 of method 200, the time domain data of the audio signal within each frame is converted into corresponding frequency domain data of the audio signal using FFT. In step 320, similar to step 220 of method 200, a frame from the available frames is selected, where the frequency domain data associated with the selected frame includes the embedded binary bit.

In step 325, similar to step 225 of method 200, the sinusoidal component with the lowest non-DC (i.e. greater than 0 Hz) frequency is chosen from the frequency domain data of the frame selected in step 320, where the chosen component embeds the bit of binary data within the frequency domain data. In step 330, determine whether the phase angle of the selected sinusoidal component with the lowest non-DC frequency is negative (i.e., between −180 and 0).

If the phase angle of the selected sinusoidal component is determined to be negative in step 330, in step 335, the embedded binary bit is determined to be "0". If the phase angle of the selected sinusoidal component is determined to be positive in step 330, in step 340, the embedded binary bit is determined to be "1". The above described method 300 can be repeated till all the binary data associated with the embedded data is detected. Once all the binary bits of the embedded data is gathered, the binary bits are converted into an original format of the embedded data, e.g., text format, pixel format for image, etc.

Figure 4:
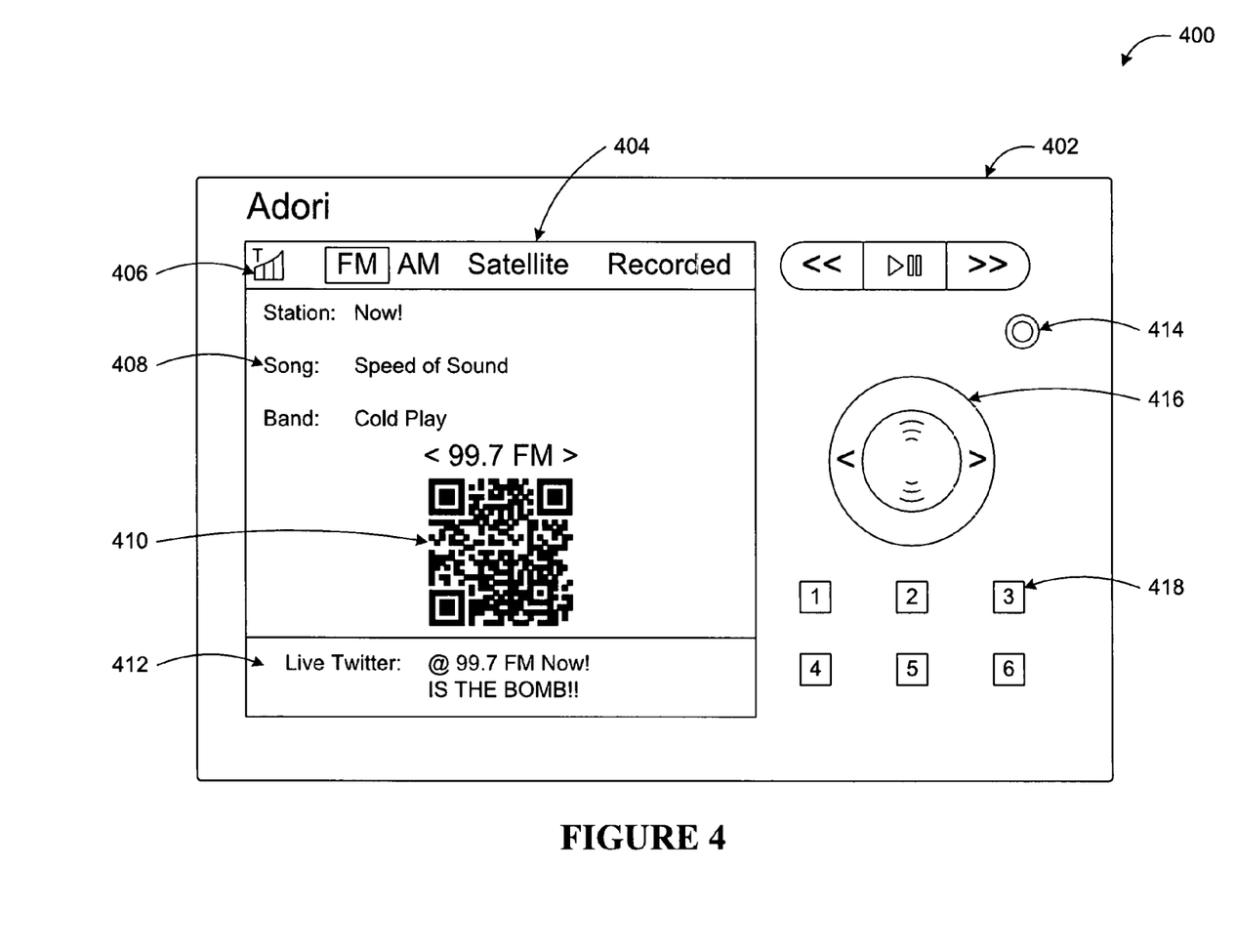
FIG. 4 provides an illustrative example of an audio streaming device that can be utilized to provide an interactive listening experience to listeners of broadcast audio programs.

FIG. 4 provides an illustrative example of an audio streaming device 108, 400, described with reference to FIG. 1A, which can be utilized to provide an interactive listening experience to listeners of broadcast audio programs. As discussed earlier, in embodiments, the audio streaming device 400 includes a touch-sensitive display screen 404 to display information related to the demodulated audio program currently being played and any embedded data decoded from the audio program being played.

As shown in FIG. 4, the displayed information related to the demodulated audio program can include the title of the song being played 408, the band associated with the song, the station the song is being broadcast on, etc. Further, the embedded data decoded from the audio program being played includes the image of the QR code 410, the real-time Tweets 412 being received by the broadcast station, etc. The audio streaming device 400 further displays the network communication status of the audio streaming device 400 as bars representing strength of wireless communication link 406.

The audio streaming device 400 further displays audio program sources as various bands, such as AM, FM, Satellite, and as recorded programs. The listener can choose any of the bands and listen to broadcast stations within the chosen bands or listen to previously recorded audio programs. The listeners can utilize the play-back controls 402, such as play, pause, rewind, fast-forward, etc., to control the play-back of the recorded audio program. The listeners can further utilize the multi-functional control knob 416 to not only control audio volume but also select the channels and programs to be played. The audio streaming device 400 further includes preset channel buttons 418 that are preprogrammed to play audio programs currently being broadcast by specific broadcast stations.

The audio streaming device 400 further includes an interactive button 414 that can be pressed to perform one or more preset functions associated with the embedded data being currently displayed. In one instance, if the embedded data being displayed includes a QR code, the audio streaming device 400 stores the QR code in the audio streaming device 400 when the button 414 is pressed. In another instance, the audio streaming device 400 can be configured to interact with broadcast station server 110 to retrieve digital coupons or purchase concert tickets using the received QR code when the button 414 is pressed. The button 414 can be further configured to initiate one or more services offered by the broadcast station server 110 when the button 414 is pressed and provide any results of the initiated service to the user through the audio streaming device 400.

In another instance, if the embedded data includes the data embedded by the artist to enable a listener to directly purchase the music from the artist, the audio streaming device 400 displays a "purchase music" text next to music currently playing through the audio streaming device 400. When the listener presses the button 414, the audio streaming device 400 utilizes the embedded data to enable the listener to purchase the music. For example, as discussed earlier, the embedded data could be a URL link to a website from where the artist's music can be purchased. In embodiments, the audio streaming device 400 can be configured to interact with broadcast station server 110 and purchase the music through the broadcast station server 110.

In embodiments, the broadcast station server 110 can include user accounts and digital wallets associated with the user accounts (discussed in detail below), where a particular audio streaming device 400 is associated with a particular user account on the broadcast station server 110. In embodiments, when the user presses the button 414 to purchase the music playing through the audio streaming device 400, the audio streaming device 400 forwards the embedded URL to the broadcast station server 110. The broadcast station server 110, in turn, identifies the user account associated with the audio streaming device 400 and retrieves any payment source previously stored in the user account. The broadcast station server 110 then utilizes the URL and the payment source to purchase and store the artist's music in the user account, enabling a one-click transaction facility to the listener.

In another instance, when the user presses the button 414 to purchase the music playing through the audio streaming device 400, the audio streaming device 400 generates a lead for the artist as a user interest query sent from the user to the URL along with the contact information of the user. For example, the audio streaming device 400 sends an email communication to a mailbox associated with the URL along with the email address of the user, expressing user's interest in purchasing the music. The artist or associated party, managing the mailbox, can then independently reach out to close the transaction with the user.

Figure 5:
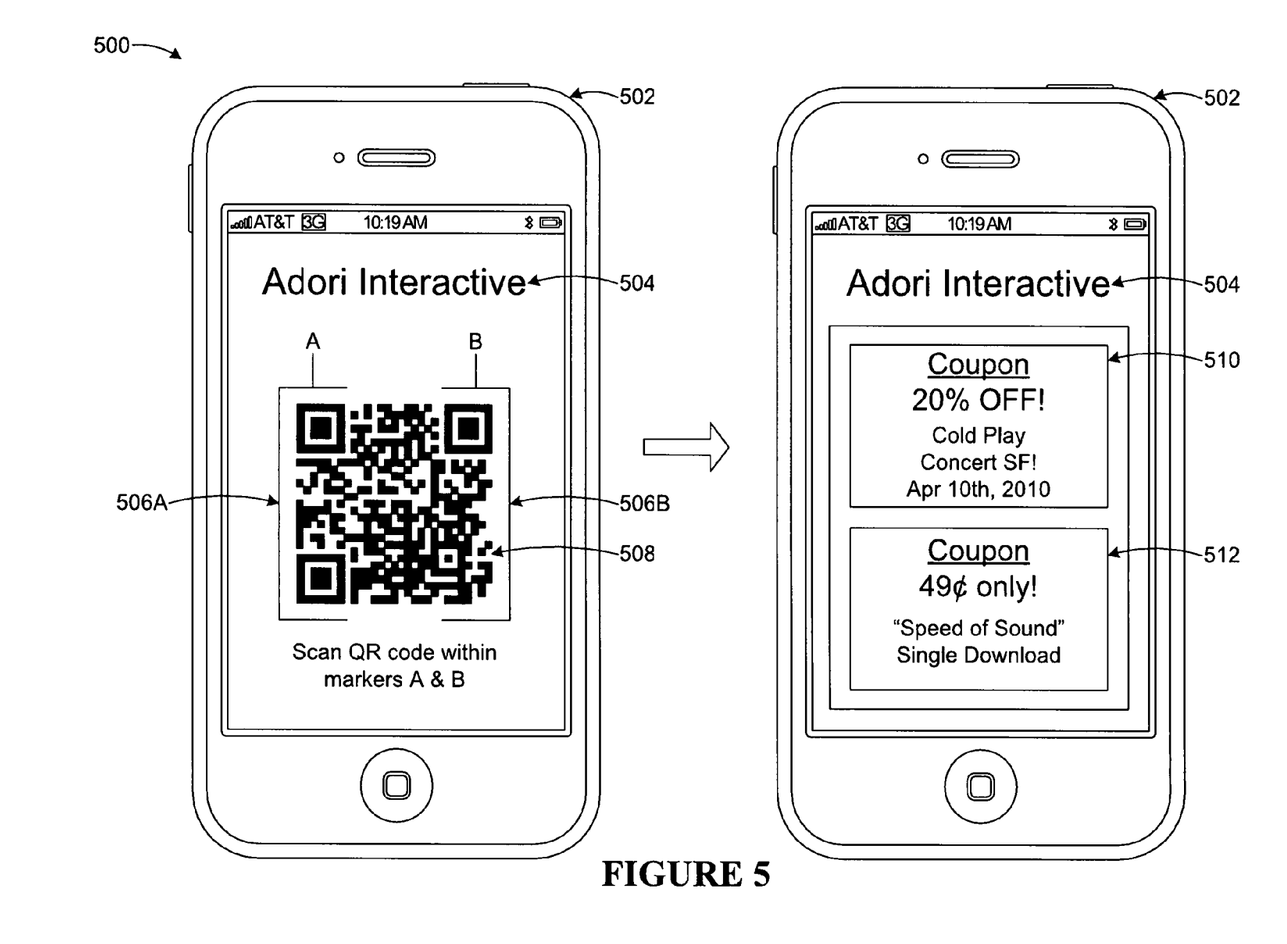
FIG. 5 provides an illustrative example of a listener utilizing a personal computing device to use the decoded embedded data for engaging in an interactive listening experience.

FIG. 5 provides an illustrative example of a listener utilizing a personal computing device 500, such as a mobile phone 502, to utilize the decoded embedded data for an interactive listening experience. As described earlier with reference to FIG. 1A and FIG. 4, the decoded embedded data can be displayed to the listener through a display screen. In embodiments, the broadcast station server 110 can have an associated App 504, which when installed on the user's smart phone 502, allows the user to interact with the broadcast station server 110 utilizing the decoded embedded data.

As discussed earlier, in some embodiments, the broadcast station server 110 can identify the information associated with the user by matching a stored user profile with any identifying information available on the smart phone 502 which can be provided by the App 504 to the broadcast station server 110. Using the user account, the broadcast station server 110 can to provide customized service to the user based on the decoded embedded data provided by the user to the broadcast station server 110.

In FIG. 5, the user can scan the QR code displayed on the audio streaming device 400 using the App 504. The App 504 then transfers the captured QR code to the broadcast station server 110. Based on the preconfigured services associated with the QR code in the local database on the broadcast station server 110, the broadcast station server determines one or more services to provide the user. In FIG. 5, the broadcast station server 110 retrieves digital coupons 510, 512 associated with the QR code and provides the retrieved coupons to the App 504.

The App 504 displays the received coupons to the user, which the user can utilize to avail of special promotions available only to listeners of the broadcast station. As discussed earlier, in embodiments, the broadcast station server 110 stores the retrieved coupon in the user account associated with the user. Further, in embodiments, the broadcast station server 110 allows the user to purchase goods and services, such as concert tickets, digital music, etc., through the broadcast station server 110 using the stored coupons.

Figure 6:
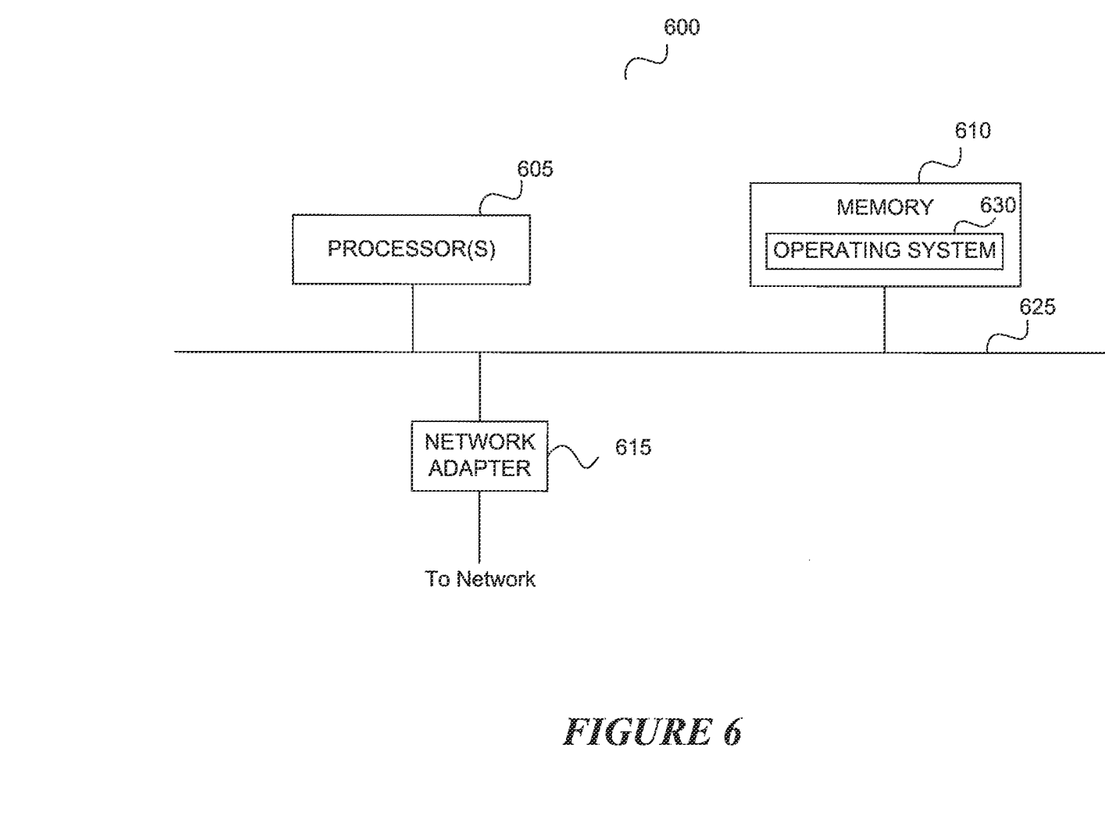
FIG. 6 is a block diagram of a processing system that can implement operations of the present invention.

FIG. 6 is a block diagram of an apparatus that may perform various operations, and store various information generated and/or used by such operations, according to an embodiment of the disclosed technique. The apparatus can represent any computer or processing system described herein. The processing system 600 is a hardware device on which any of the entities, components or services depicted in the examples of FIGS. 1-5 (and any other components described in this specification) can be implemented, such as query prediction unit, storage unit, stats depot etc.

The processing system 600 includes one or more processors 605 and memory 610 coupled to an interconnect 615. The interconnect 615 is shown in FIG. 6 as an abstraction that represents any one or more separate physical buses, point to point connections, or both connected by appropriate bridges, adapters, or controllers. The interconnect 615, therefore, may include, for example, a system bus, a Peripheral Component Interconnect (PCI) bus or PCI-Express bus, a HyperTransport or industry standard architecture (ISA) bus, a small computer system interface (SCSI) bus, a universal serial bus (USB), IIC (I2C) bus, or an Institute of Electrical and Electronics Engineers (IEEE) standard 1394 bus, also called "Firewire".

The processor(s) 605 is/are the central processing unit (CPU) of the processing system 600 and, thus, control the overall operation of the processing system 600. In certain embodiments, the processor(s) 605 accomplish this by executing software or firmware stored in memory 610. The processor(s) 605 may be, or may include, one or more programmable general-purpose or special-purpose microprocessors, digital signal processors (DSPs), programmable controllers, application specific integrated circuits (ASICs), programmable logic devices (PLDs), trusted platform modules (TPMs), or the like, or a combination of such devices.

The memory 610 is or includes the main memory of the processing system 600. The memory 610 represents any form of random access memory (RAM), read-only memory (ROM), flash memory, or the like, or a combination of such devices. In use, the memory 610 may contain a code. In one embodiment, the code includes a general programming module configured to recognize the general-purpose program received via the computer bus interface, and prepare the general-purpose program for execution at the processor. In another embodiment, the general programming module may be implemented using hardware circuitry such as ASICs, PLDs, or field-programmable gate arrays (FPGAs).

Also connected to the processor(s) 605 through the interconnect 615 are a network adapter 630, a storage device(s) 620 and I/O device(s) 625. The network adapter 630 provides the processing system 600 with the ability to communicate with remote devices, over a network and may be, for example, an Ethernet adapter or Fibre Channel adapter. The network adapter 630 may also provide the processing system 600 with the ability to communicate with other computers within the cluster. In some embodiments, the processing system 600 may use more than one network adapter to deal with the communications within and outside of the cluster separately.

The I/O device(s) 625 can include, for example, a keyboard, a mouse or other pointing device, disk drives, printers, a scanner, and other input and/or output devices, including a display device. The display device can include, for example, a cathode ray tube (CRT), liquid crystal display (LCD), or some other applicable known or convenient display device.

The code stored in memory 610 can be implemented as software and/or firmware to program the processor(s) 605 to carry out actions described above. In certain embodiments, such software or firmware may be initially provided to the processing system 600 by downloading it from a remote system through the processing system 600 (e.g., via network adapter 630).

The techniques introduced herein can be implemented by, for example, programmable circuitry (e.g., one or more microprocessors) programmed with software and/or firmware, or entirely in special-purpose hardwired (non-programmable) circuitry, or in a combination of such forms. Special-purpose hardwired circuitry may be in the form of, for example, one or more ASICs, PLDs, FPGAs, etc.

Software or firmware for use in implementing the techniques introduced here may be stored on a machine-readable storage medium and may be executed by one or more general-purpose or special-purpose programmable microprocessors. A "machine-readable storage medium", as the term is used herein, includes any mechanism that can store information in a form accessible by a machine.

A machine can also be a server computer, a client computer, a personal computer (PC), a tablet PC, a laptop computer, a set-top box (STB), a personal digital assistant (PDA), a cellular telephone, an iPhone, a Blackberry, a processor, a telephone, a web appliance, a network router, switch or bridge, or any machine capable of executing a set of instructions (sequential or otherwise) that specify actions to be taken by that machine.

A machine-accessible storage medium or a storage device(s) 620 includes, for example, recordable/non-recordable media (e.g., ROM; RAM; magnetic disk storage media; optical storage media; flash memory devices; etc.), etc., or any combination thereof. The storage medium typically may be non-transitory or include a non-transitory device. In this context, a non-transitory storage medium may include a device that is tangible, meaning that the device has a concrete physical form, although the device may change its physical state. Thus, for example, non-transitory refers to a device remaining tangible despite this change in state.

The term "logic", as used herein, can include, for example, programmable circuitry programmed with specific software and/or firmware, special-purpose hardwired circuitry, or a combination thereof.

What is claimed is:

1. An interactive audio system comprising:
a processing module;
a receiver module for receiving a radio frequency (RF) carrier signal associated with a broadcast station;
at least one memory storing computer-executable instructions, wherein the processing module is configured to access the at least one memory and execute the computer-executable instructions to perform a set of acts, the acts including:
shifting a frequency associated with the received RF carrier signal to an intermediate frequency (IF);
demodulating the frequency shifted portion of the RF carrier signal associated with the broadcast station, the demodulation resulting in an output signal;
extracting an embedded data from the demodulated output signal, wherein extracting the embedded data from the demodulated output signal includes:
generating a spectral data associated with the demodulated output signal, the spectral data including a plurality of sinusoidal components and its corresponding phase angle associated with each of the plurality of sinusoidal components; and
determining the binary value embedded within the output signal as a function of a phase angle associated with one or more of the sinusoidal components, wherein a positive phase angle of a given sinusoidal component is associated with one of a two possible binary values, wherein a negative phase angle of the given sinusoidal component is associated with the other of the two possible binary values; and
serving the embedded data in conjunction with the demodulated output signal.

2. The audio system of claim 1, the acts further including:
sending the extracted embedded data to a computing system, wherein the computing system provides one or more services associated with embedded data, the one or more provided services being associated with the party associated with the embedded data;
receiving a response from the computing system, the response including information associated with a given service associated with a given embedded data; and
serving the received response.

3. The audio system of claim 2, wherein the one or more services provided by the computing system when the embedded data is received includes:
retrieving and storing a digital coupon associated with the embedded data;

purchasing a digital music;
purchasing an admission pass for an event; or
purchasing a merchandise from a vendor associated with the embedded data.

4. The audio system of claim 2, wherein the received response includes one or more of:
a digital coupon associated with the embedded data;
a digital music;
an admission pass for an event; or
a receipt for a purchase of a merchandise from a vendor associated with the embedded data.

5. The audio system of claim 1, wherein the embedded data includes dynamic user generated data, the dynamic user generated data being embedded within the output signal, wherein the output signal with the embedded data is modulated over the RF carrier signal, the RF carrier signal with the modulated output signal being broadcast by the broadcast station.

6. The audio system of claim 5, wherein the dynamic user generated data is converted into a binary data format before being embedded into the output signal.

7. The audio system of claim 6, wherein embedding the binary data within the output signal includes:
generating a spectral data associated with the output signal, the spectral data including a plurality of sinusoidal components and its corresponding phase angle associated with each of the plurality of sinusoidal components;
based on a value of the binary data being embedded, shifting the phase angle of a particular sinusoidal component by 180 degrees, wherein a positive phase angle of a given sinusoidal component is associated with one of a two possible binary values, wherein a negative phase angle of the given sinusoidal component is associated with the other of the two possible binary values; and
generating the output signal from the spectral data, the spectral data including the particular sinusoidal component with the embedded value of the binary data.

8. The audio system of claim 1, wherein the dynamic user generated data includes one or more of:
a text message;
an image;
a multimedia content;
a digital coupon;
a marketing promotion associated content;
a quick response (QR) code; or
a barcode.

9. The audio system of claim 1, wherein the embedded data can be utilized to interact with a party associated the embedded data.

10. The audio system of claim 1, wherein the output signal is an audio program broadcast by a particular broadcast station.

11. A method, comprising:
receiving, by a computing system including a processor, a radio frequency (RF) carrier signal associated with a broadcast station;
shifting, by the computing system, a frequency associated with the received RF carrier signal to an intermediate frequency (IF);
demodulating, by the computing system, the frequency shifted portion of the RF carrier signal associated with the broadcast station, the demodulation resulting in an output signal;
extracting, by the computing system, an embedded data from the demodulated output signal, wherein extracting the embedded data from the demodulated output signal includes:
generating, by the computing system, a spectral data associated with the demodulated output signal, the spectral data including a plurality of sinusoidal components and its corresponding phase angle associated with each of the plurality of sinusoidal components; and
determining, by the computing system, the binary value embedded within the output signal as a function of a phase angle associated with a particular sinusoidal component, wherein a positive phase angle of a given sinusoidal component is associated with one of a two possible binary values, wherein a negative phase angle of the given sinusoidal component is associated with the other of the two possible binary values; and
serving, by the computing system, the embedded data in conjunction with the demodulated output signal.

12. The method of claim 11, further including:
sending, by the computing system, the extracted embedded data to a broadcast station server, the broadcast station server including a processor, wherein the broadcast station server provides one or more services associated with embedded data, the one or more provided services being associated with the party associated with the embedded data;
receiving, by the computing system, a response from the broadcast station server, the response including information associated with a given service associated with a given embedded data; and
serving, by the computing system, the received response.

13. The method of claim 12, wherein the one or more services provided by the broadcast station server when the embedded data is received includes:
retrieving and storing a digital coupon associated with the embedded data;
purchasing a digital music;
purchasing an admission pass for an event; or
purchasing a merchandise from a vendor associated with the embedded data.

14. The method of claim 12, wherein the received response includes one or more of:
a digital coupon associated with the embedded data;
a digital music;
an admission pass for an event; or
a receipt for a purchase of a merchandise from a vendor associated with the embedded data.

15. The method of claim 11, wherein the embedded data includes dynamic user generated data, the dynamic user generated data being embedded within the output signal, wherein the output signal with the embedded data is modulated over the RF carrier signal, the RF carrier signal with the modulated output signal being broadcast by the broadcast station.

16. The method of claim 15, wherein the dynamic user generated data is converted into a binary data format before being embedded into the output signal.

17. The method of claim 16, wherein embedding the binary data within the output signal includes:
generating a spectral data associated with the output signal, the spectral data including a plurality of sinusoidal components and its corresponding phase angle associated with each of the plurality of sinusoidal components;

based on a value of the binary data being embedded, shifting the phase angle of a particular sinusoidal component by 180 degrees, wherein a positive phase angle of a given sinusoidal component is associated with one of a two possible binary values, wherein a negative phase angle of the given sinusoidal component is associated with the other of the two possible binary values; and generating the output signal from the spectral data, the spectral data including the particular sinusoidal component with the embedded value of the binary data.

18. The method of claim 11, wherein the dynamic user generated data includes one or more of:
   a text message;
   an image;
   a multimedia content;
   a digital coupon;
   a marketing promotion associated content;
   a quick response (QR) code; or
   a barcode.

19. The method of claim 11, wherein the embedded data can be utilized to interact with a party associated the embedded data.

20. The method of claim 11, wherein the output signal is an audio program broadcast by a particular broadcast station.

21. An interactive audio system comprising:
   a processor;
   means for receiving a radio frequency (RF) carrier signal associated with a broadcast station;
   at least one memory storing computer-executable instructions, wherein the processor is configured to access the at least one memory and execute the computer-executable instructions to perform a set of acts, the acts including:
      shifting a frequency associated with the received RF carrier signal to an intermediate frequency (IF);
      demodulating the frequency shifted portion of the RF carrier signal associated with the broadcast station, the demodulation resulting in an output signal;
      extracting an embedded data from the demodulated output signal, wherein extracting the embedded data from the demodulated output signal includes:
         generating a spectral data associated with the demodulated output signal, the spectral data including a plurality of sinusoidal components and its corresponding phase angle associated with each of the plurality of sinusoidal components; and
         determining the binary value embedded within the output signal as a function of a phase angle associated with one or more sinusoidal components, wherein a positive phase angle of a given sinusoidal component is associated with one of a two possible binary values, wherein a negative phase angle of the given sinusoidal component is associated with the other of the two possible binary values; and
      serving the embedded data in conjunction with the demodulated output signal.

22. The audio system of claim 21, the acts further including:
   sending the extracted embedded data to a computing system, wherein the computing system provides one or more services associated with embedded data, the one or more provided services being associated with the party associated with the embedded data;
   receiving a response from the computing system, the response including information associated with a given service associated with a given embedded data; and
   serving the received response.

23. The audio system of claim 22, wherein the one or more services provided by the computing system when the embedded data is received includes:
   retrieving and storing a digital coupon associated with the embedded data;
   purchasing a digital music;
   purchasing an admission pass for an event; or
   purchasing a merchandise from a vendor associated with the embedded data.

24. The audio system of claim 22, wherein the received response includes one or more of:
   a digital coupon associated with the embedded data;
   a digital music;
   an admission pass for an event; or
   a receipt for a purchase of a merchandise from a vendor associated with the embedded data.

25. The audio system of claim 21, wherein the embedded data includes dynamic user generated data, the dynamic user generated data being embedded within the output signal, wherein the output signal with the embedded data is modulated over the RF carrier signal, the RF carrier signal with the modulated output signal being broadcast by the broadcast station.

26. The audio system of claim 25, wherein the dynamic user generated data is converted into a binary data format before being embedded into the output signal.

27. The audio system of claim 26, wherein embedding the binary data within the output signal includes:
   generating a spectral data associated with the output signal, the spectral data including a plurality of sinusoidal components and its corresponding phase angle associated with each of the plurality of sinusoidal components;
   based on a value of the binary data being embedded, shifting the phase angle of a particular sinusoidal component by 180 degrees, wherein a positive phase angle of a given sinusoidal component is associated with one of a two possible binary values, wherein a negative phase angle of the given sinusoidal component is associated with the other of the two possible binary values; and
   generating the output signal from the spectral data, the spectral data including the particular sinusoidal component with the embedded value of the binary data.

28. The audio system of claim 21, wherein the dynamic user generated data includes one or more of:
   a text message;
   an image;
   a multimedia content;
   a digital coupon;
   a marketing promotion associated content;
   a quick response (QR) code; or
   a barcode.

29. The audio system of claim 21, wherein the embedded data can be utilized to interact with a party associated the embedded data.

30. The audio system of claim 21, wherein the output signal is an audio program broadcast by a particular broadcast station.

* * * * *